(12) United States Patent
Garg et al.

(10) Patent No.: US 8,504,953 B2
(45) Date of Patent: Aug. 6, 2013

(54) SCHEMATIC GENERATION VISUALIZATION AID FOR NETLISTS COMPRISING ANALOG CIRCUITS

(75) Inventors: Bikram Garg, Patiala (IN); Rajeev Sehgal, Noida (IN); Amarpal Singh, Ghaziabad (IN)

(73) Assignee: Mentor Graphics Corporation, Wilsonville, OR (US)

( * ) Notice: Subject to any disclaimer, the term of this patent is extended or adjusted under 35 U.S.C. 154(b) by 139 days.

(21) Appl. No.: 12/574,645

(22) Filed: Oct. 6, 2009

(65) Prior Publication Data

US 2010/0095262 A1    Apr. 15, 2010

Related U.S. Application Data

(60) Provisional application No. 61/103,189, filed on Oct. 6, 2008.

(51) Int. Cl.
*G06F 9/45* (2006.01)

(52) U.S. Cl.
USPC ............................ 716/103; 716/110; 716/119

(58) Field of Classification Search
USPC .......................................... 716/103, 110, 119
See application file for complete search history.

(56) References Cited

U.S. PATENT DOCUMENTS

| 6,209,123 | B1 * | 3/2001 | Maziasz et al. | 716/123 |
| 7,917,877 | B2 * | 3/2011 | Singh et al. | 716/118 |
| 2009/0282379 | A1 * | 11/2009 | Singh et al. | 716/8 |

* cited by examiner

*Primary Examiner* — Thuan Do
*Assistant Examiner* — Mohammed Alam
(74) *Attorney, Agent, or Firm* — Plumsea Law Group, LLC

(57) ABSTRACT

The invention concerns the generation of schematics from analog netlists. Various implementations of the invention provide that an analog netlist defining a number of hardware components and the connectivity between the hardware components is identified. Subsequently, the netlist is sorted and partitioned into component groups. The component groups are arranged and lines are routed between the component groups. The corresponding hardware components are arranged within the component groups and a schematic corresponding to the arranged hardware components is generated.

27 Claims, 12 Drawing Sheets

US 8,504,953 B2

SCHEMATIC GENERATION VISUALIZATION AID FOR NETLISTS COMPRISING ANALOG CIRCUITS

RELATED PATENT APPLICATIONS

The present application claims priority under 35 U.S.C. §119(e) to U.S. Provisional Patent Application No. 61/103,189, entitled "Schematic Generation From Analog Netlists," filed on Oct. 6, 2008 and naming Bikram Garg et al. as inventors, which application is incorporated entirely herein by reference.

FIELD OF THE INVENTION

The invention relates to the field of electronic design automation. More particularly, various implementations of the invention are applicable to generating schematics from an analog netlist description of a circuit.

BACKGROUND OF THE INVENTION

Electronic circuits, such as integrated microcircuits, are used in a variety of products, from automobiles to microwaves to personal computers. Designing and fabricating microcircuit devices typically involves many steps, sometimes referred to as the "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design. These various microcircuits are often referred to as integrated circuits (IC's).

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit, i.e. that the logical design conforms to the specification. This analysis is sometimes referred to as "formal verification."

After the logical design is verified, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, often mathematically, to confirm that the circuit described by the device design conforms to the logical design, and as a result, the specification. This analysis is also sometimes referred to as formal verification.

Once the components and their interconnections are established, the design is again transformed, this time into a physical design that describes specific geometric elements. The geometric elements, which typically are polygons, define the shapes that will be created in various layers of material to manufacture the circuit. This type of design often is referred to as a "layout" design. The layout design is then used as a template to manufacture the integrated circuit. More particularly, the integrated circuit devices are manufactured, by for example an optical lithographic process, using the layout design as a template.

As indicated above, device designs may often be in the form of either a schematic or a netlist. As those of skill in the art can appreciate, a netlist details the parts, often referred to as hardware components, which make up a device design. In addition to listing the hardware components included in a device design, a netlist details the connectivity of the device design. Netlists are typically text based, and is often quite literally a list of the components and connections between the components of the device design.

Due to the complexity of modern electronic device designs, a device is not easily visualized by the designer from the netlist alone. As a result, tools are available that generate a schematic from a netlist. However, with the growing complexity of modern designs it has become increasing difficult to generate a schematic from a netlist that is "useful" to the designer. This is particularly true where the netlist includes hardware components that are transistors. One difficulty in generating a "useful" schematic is that often the generated schematic is not deterministic. That is, two netlists referencing the same hardware components and connectivity, but having a different sequence of listing the hardware components in the netlist will result in two different schematics.

Another difficulty in generating "useful" schematics is that prior art schematic generation tools often generate schematics that are not comparable to a manually drawn schematic. For example, in a manually drawn schematic, designers will often place a number of transistors that combined form a particular logic function near each other in such a manner that the logic function may be easily recognizable to a designer viewing the schematic. Additionally, components should "ideally" be organized so that the flow of current and the flow of signals through the schematic is apparent and that there are a minimum of bends and crossovers in the wires connecting various components.

SUMMARY OF THE INVENTION

Implementations of the invention provide methods and apparatuses for generating a schematic from an analog netlist. In various implementations of the invention, an analog netlist defining a number of hardware components and the connectivity between the hardware components is identified. Subsequently, the netlist is sorted and partitioned into component groups. The component groups are arranged and lines are routed between the component groups. The corresponding hardware components are arranged within the component groups and a schematic corresponding to the arranged hardware components is generated.

With various implementations of the invention, the netlist is partitioned into component groups by identifying hardware components that combined form a logic function, such as for example two transistors forming the AND function, forming a component group corresponding to the identified hardware components, and replacing the identified hardware components in the netlist with the component group. Subsequently, the components groups, and corresponding hardware components may be arranged, lines routed between the component groups, and a schematic generated based upon the arranged hardware components.

These and additional implementations of the invention will be further understood from the following detailed disclosure of illustrative embodiments.

BRIEF DESCRIPTION OF THE DRAWINGS

The present invention will be described by way of illustrative embodiments shown in the accompanying drawings in which like references denote similar elements, and in which.

DETAILED DESCRIPTION OF ILLUSTRATIVE IMPLEMENTATIONS

Although the operations of the disclosed techniques are described in a particular sequential order for convenient presentation, it should be understood that this manner of description encompasses rearrangements, unless a particular ordering is required by specific language set forth below. For example, operations described sequentially may in some cases be rearranged or performed concurrently. Additionally, the detailed description sometimes uses terms like "determine" to describe the disclosed techniques. Such terms are high-level abstractions of the actual operations that are performed. The actual operations that correspond to these terms may vary depending on the particular implementation.

Some of the techniques described herein can be implemented by software stored on one or more computer readable storage medium and executed on a computer. Additionally, some of the disclosed techniques may be implemented as part of a computer implemented electronic design automation (EDA) tool. The selected techniques could be executed on a single computer or a computer networked with another computer or computers. For clarity, only those aspects of the tools or computer germane to the disclosed techniques are described; product details well known in the art may be omitted.

Illustrative Computing Environment

Figure 1:
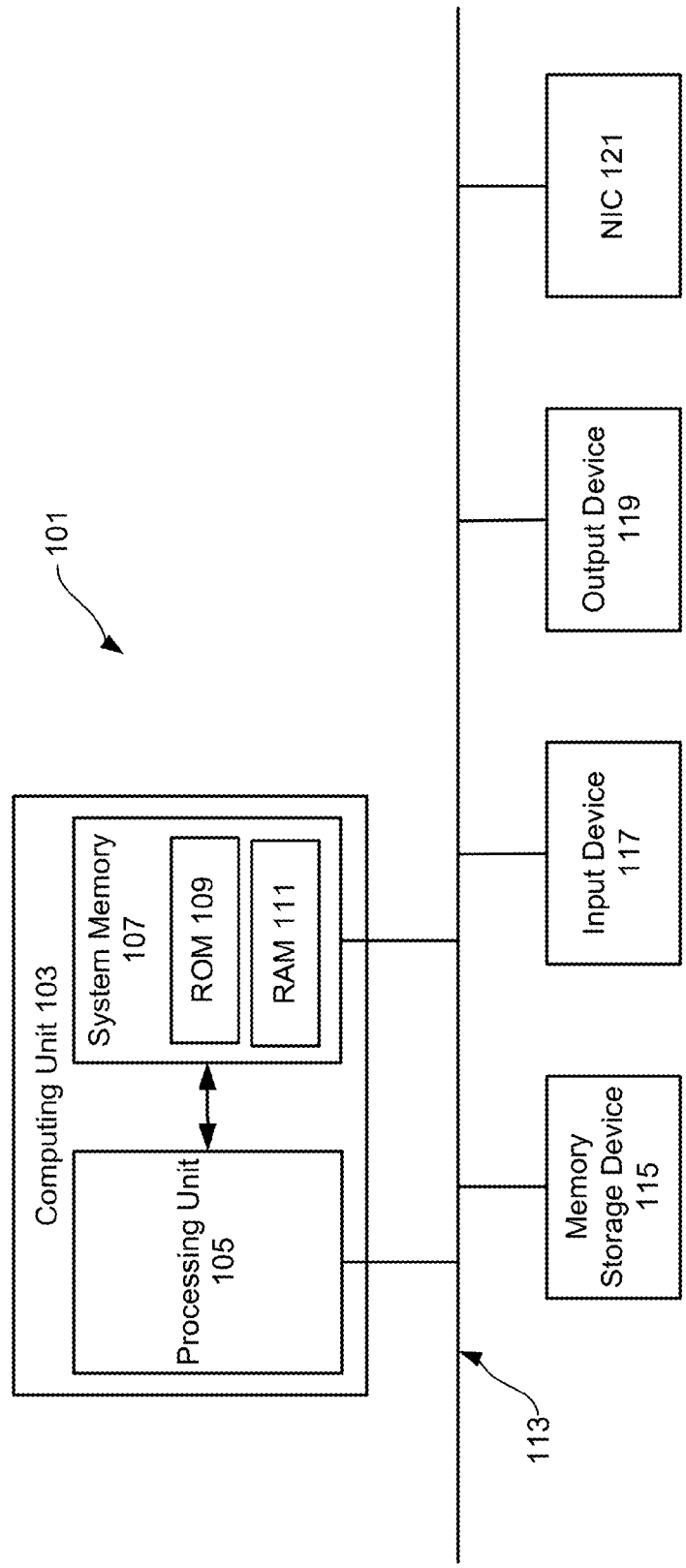
FIG. 1 shows an illustrative computing device.

As stated, various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory 109 and the random access memory 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices 115. The memory storage devices 115 may include, for example, a "hard" magnetic disk drive, a solid state disk drive, an optical disk drive, and a removable disk drive. The processing unit 105 and the system memory 107 also may be directly or indirectly connected to one or more input devices 117 and one or more output devices 119. The input devices 117 may include, for example, a keyboard, a pointing device (such as a mouse, touchpad, stylus, trackball, or joystick), a scanner, a camera, and a microphone. The output devices 119 may include, for example, a display device, a printer and speakers. With various examples of the computing device 101, one or more of the peripheral devices 115-119 may be internally housed with the computing unit 103. Alternately, one or more of the peripheral devices 115-119 may be external to the housing for the computing unit 103 and connected to the bus 113 through, for example, a Universal Serial Bus (USB) connection or a digital visual interface (DVI) connection.

With some implementations, the computing unit 103 may also be directly or indirectly connected to one or more network interfaces cards (NIC) 121, for communicating with other devices making up a network. The network interface cards 121 translate data and control signals from the computing unit 103 into network messages according to one or more communication protocols, such as the transmission control protocol (TCP) and the Internet protocol (IP). Also, the network interface cards 121 may employ any suitable connection agent (or combination of agents) for connecting to a network, including, for example, a wireless transceiver, a modem, or an Ethernet connection.

It should be appreciated that the computing device 101 is illustrated as an example only, and it not intended to be limiting. Various embodiments of the invention may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Illustrative Netlist and Device Design

Figure 2:
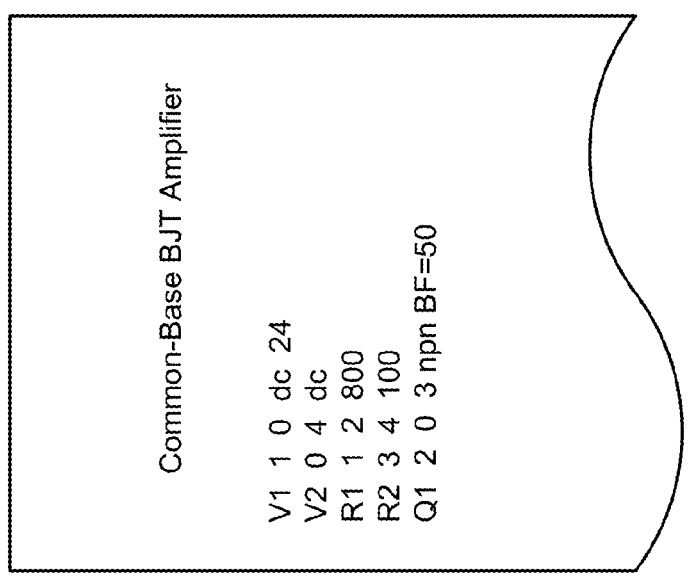
FIG. 2 shows an example netlist.

As stated above, a netlist details hardware components and the interconnectivity between the hardware components that make up a device design. FIG. 2 illustrates a netlist 201. As can be seen from this figure, the netlist 201 is a text file that lists various hardware components and the connectivity between the hardware components that make up the device design entitled "Common-Base BJT Amplifier". As can be further seen from this figure, the device design includes voltage sources V1 and V2, resistors R1 and R2 and a transistor Q1. Each time a hardware component is referenced in a netlist, a name, such as for example V1, is used to identify the component. Additionally, the connectivity (often referred to as "nets" or "nodes") of the components are defined. For example, the nodes for the component V1 are listed as 0 and 1. Accordingly, the component V1 is connected to the $0^{th}$ and $1^{st}$ nodes. Those of skill in the art can appreciate, that various standards and formats for netlists exist, such as for example the electronic design interchange format (EDIF).

Figure 3:
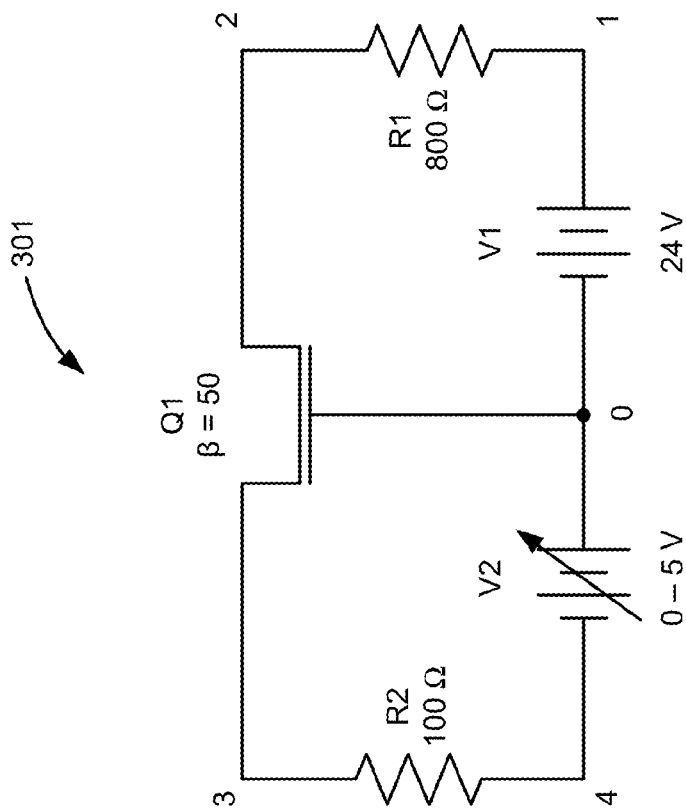
FIG. 3 illustrates a schematic corresponding to the netlist of FIG. 2.

Based upon the listed hardware components and their node connections, a corresponding schematic may be drawn. FIG. 3 illustrates a schematic 301 that corresponds to the netlist 201. As can be seen from this figure, the schematic 301 includes voltage sources V1 and V2, resistors R1 and R2 as well as the transistor Q1. Additionally, the nodes or connectivity of the hardware components is also represented by the schematic 301. For example, with respect to the hardware component R1, it is defined by the netlist 201 as having a resistance value of 800 ohms and being connected to nodes 1 and 2, which is represented in the schematic 301. Those of skill in the art can appreciate that the netlist 201 and the corresponding schematic 301 are a simple example of a device design. In practice modern device designs include thousands or more components. Accordingly, modern netlists are significantly more complex than the netlist 201. As a result, generating a schematic is also more complex. As stated above, generating a schematic that is useful to a designer can be even more difficult.

Schematic Generation from a Netist

Figure 4:
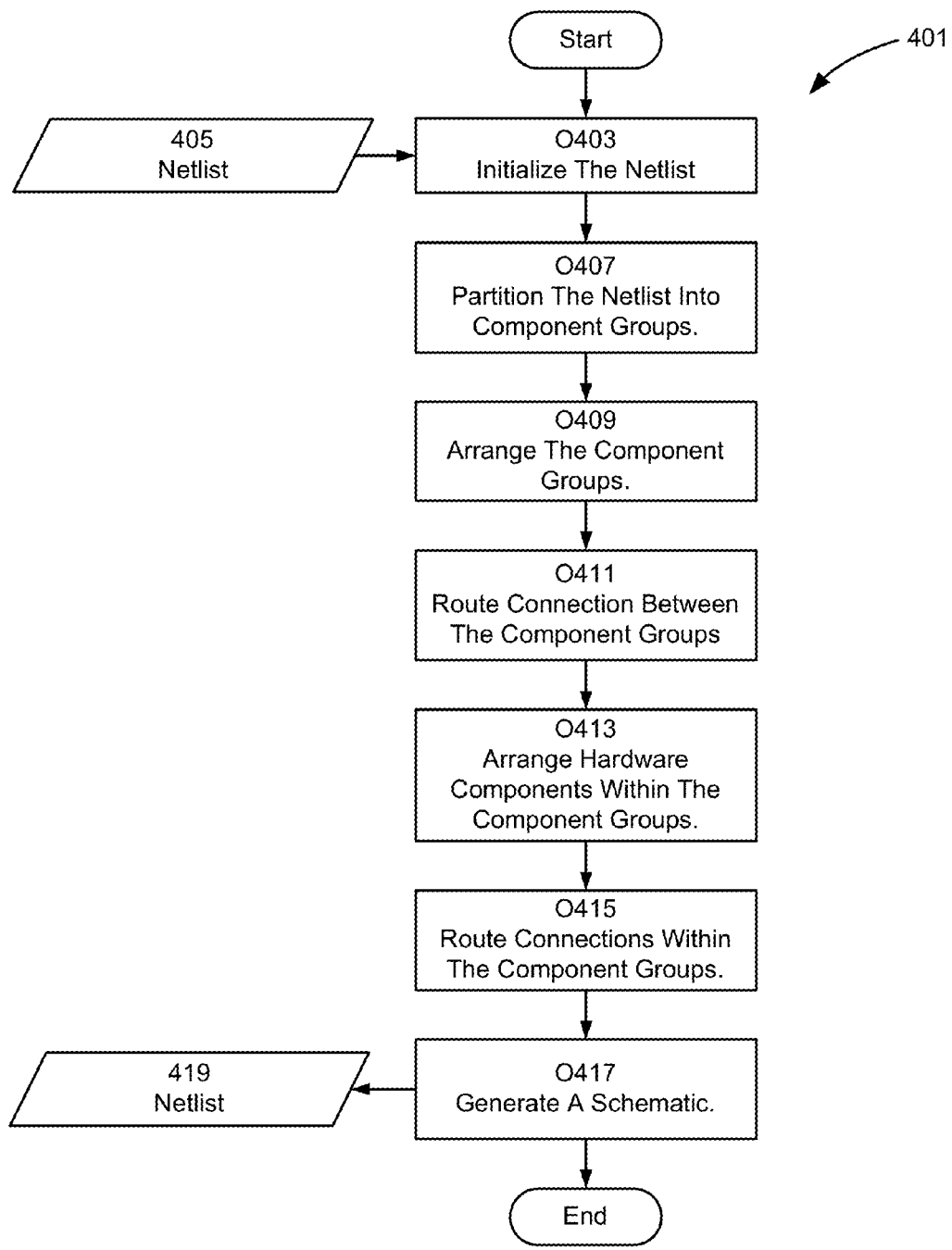
FIG. 4 illustrates a method of generating a schematic from an analog netlist.

FIG. 4 illustrates a method 401 for generating a schematic from an analog netlist according to various implementations of the present invention. As can be seen from this figure, the method 401 includes an operation 403 for initializing a netlist 405. The method 401 further includes an operation 407 for partitioning the netlist 405 into component groups. More particularly, the operation 407 groups the hardware components listed in the netlist 405 into smaller collections of hardware components, referred to herein as component groups. Additionally, an operation 409 and an operation 411 are included for arranging the component groups and routing connections between the component groups respectively. Further still, an operation 413 and an operation 415 for arranging the hardware components within each component group and routing connecting between these hardware components is provided. Subsequently, as can be seen from this figure, an operation 417 is provided for generating a schematic 419 that corresponds to the netlist 405.

Netlist Initialization

Figures 5, 6:
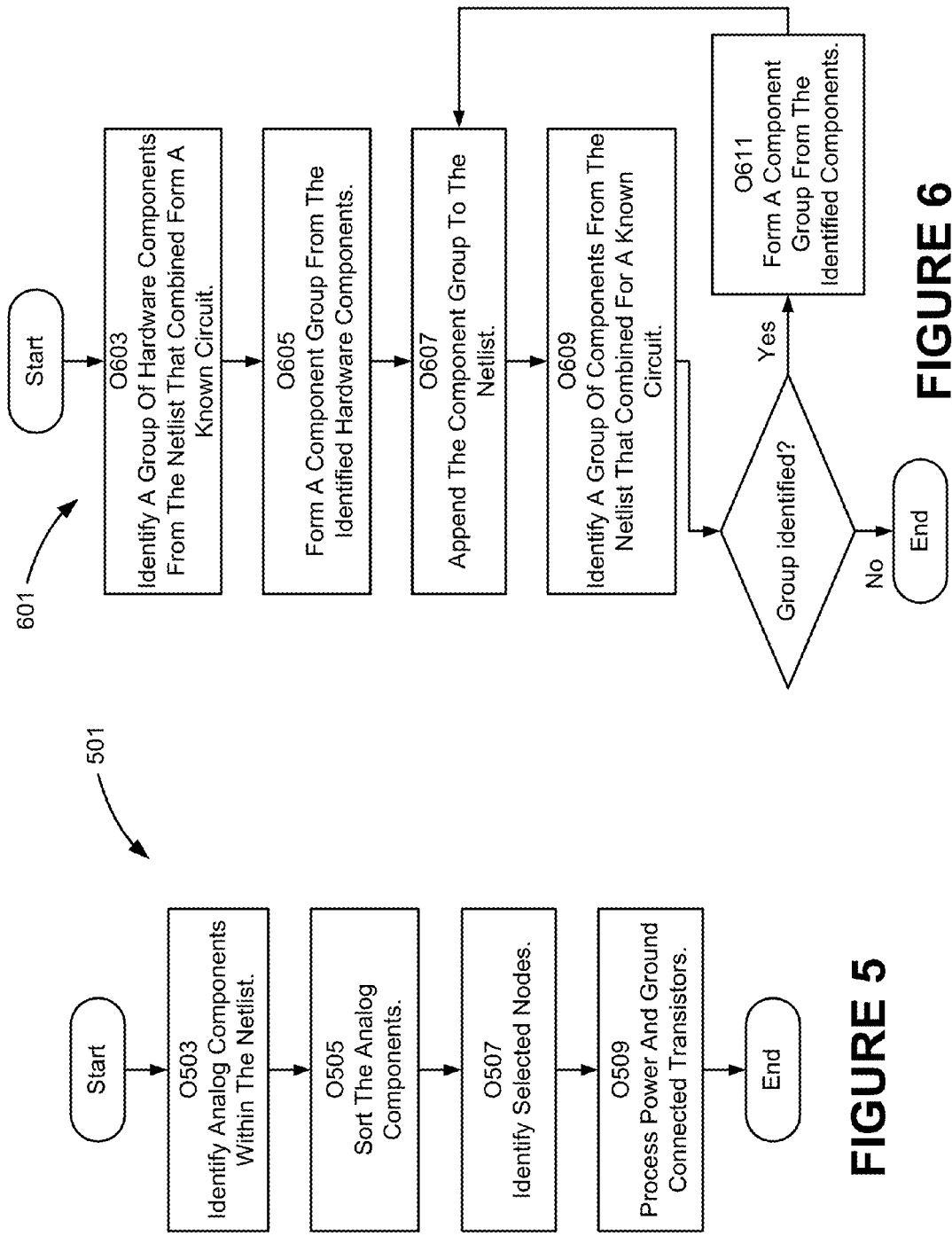
FIG. 5 illustrates a method of initializing a netlist.
FIG. 6 illustrates a method of partitioning a netlist.

In various implementations of the invention, the operation 403 initializes the netlist 405 according to the method 501 shown in FIG. 5. As can be seen from this figure, the method 501 includes an operation 503 for identifying the analog components (i.e. resistors, capacitors, and transistors) within the netlist 405, an operation 505 for sorting the analog components, an operation 507 for identifying selected nodes within the netist 405, and an operation 509 for processing power and ground connected transistors within the netlist 405. With some implementations, the operation 505 sorts the analog components based upon their name, such as for example, sorting the component in alphabetical order. Sorting the components results in a schematic that is deterministic. More particularly, due to sorting, schematics generated for two netlists having the same hardware components and connectivity will look the same irrespective of the ordering of the components within the netlist.

As stated, the operation 507 identifies selected nodes within the netlist 405. In various implementations, the operation 507 identifies those nodes connected to power and ground, often referred to as power and ground nodes respectively. With some implementations, the operation 507 identifies those nodes connected to multiple hardware components. These nodes are often referred to as "bulk" nodes. In still various implementations, the operation 507 identifies the power, ground, and bulk nodes.

The operation 509 is provided for processing power and ground connected transistors within the netlist 405. In various implementations of the invention, transistors that have their "drain" port connected to power or transistors that have their "source" port connected to ground are identified. Subsequently, the operation 509 may "flip" the ordering of the connections of these identified transistors. For example, for those components having their "drain" pins connected to power, the operation 509 may reverse the transistors pins such that the functioning and connectivity of the design is preserved, but a schematic generated from these reversed connections conforms to preferred practices.

Netlist Partitioning

Referring back to FIG. 4, as described, the method 401 includes the operation 407 for partitioning the netlist 405. In various implementations of the invention, the operation 407 partitions the netlist 405 according to the method 601 illustrated in FIG. 6. As can be seen from this figure, the method 601 includes an operation 603 for identifying a group of hardware components from the netlist, which combined form a known circuit, and an operation 605 for forming a component group from the identified hardware components. The method 601 further includes an operation 607 for appending the component group to the netlist, an operation 609 for identifying a group of components from the netlist that combined form a known circuit, and an operation 611 for forming a component group from the identified components. As seen in this figure, if a grouping is identified by the operation 609, the operation 611 is processed, and the method returns to the operation 607 for appending the component group to the netlist and proceeding to identify an additional group of components that form a known circuit (i.e. by the operation 609). As illustrated, in various implementations, the method 601 may recursively processes the netlist to combine components within the netlist into "larger" component groups that represent certain known circuits, until no more combinable elements are identified.

Figure 7:
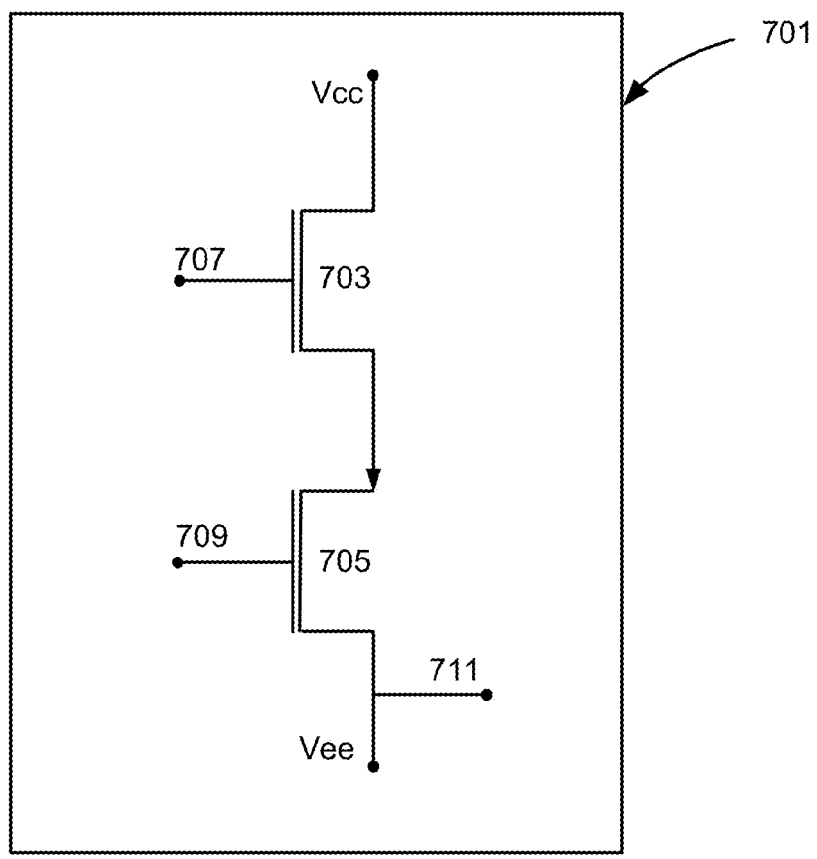
FIG. 7 illustrates a logic circuit.

In various implementations of the invention, the operation 603 or the operation 609 may identify a group of transistors connected either in series or parallel, which combined represent a logic function. For example, FIG. 7 illustrates a circuit 701, which includes transistors 703 and 705, inputs 707 and 709, and an output 711. As can be seen form this figure, the transistors 703 and 705 are connected in series, which as those of skill in the art can appreciate, forms the logic function 711=!(707 & 709) and is often represented by a NAND gate. Accordingly, transistors 703 and 705 may, in various implementations, be identified by the operation 603 or the operation 609 and subsequently included into a component group by the operation 605 or the operation 611. With some implementations of the invention, the known circuit forms an OR gate. Accordingly, transistors connected in parallel, which as those of skill in the art can appreciate, may form an OR gate, may be identified and subsequently formed into a component group. In further implementations, the known circuit forms other gates, such as for example, an AND gate, an OR gate, a NOT gate, a NAND gate, a NOR gate, an XOR gate, and a XNOR gate.

Figure 8:
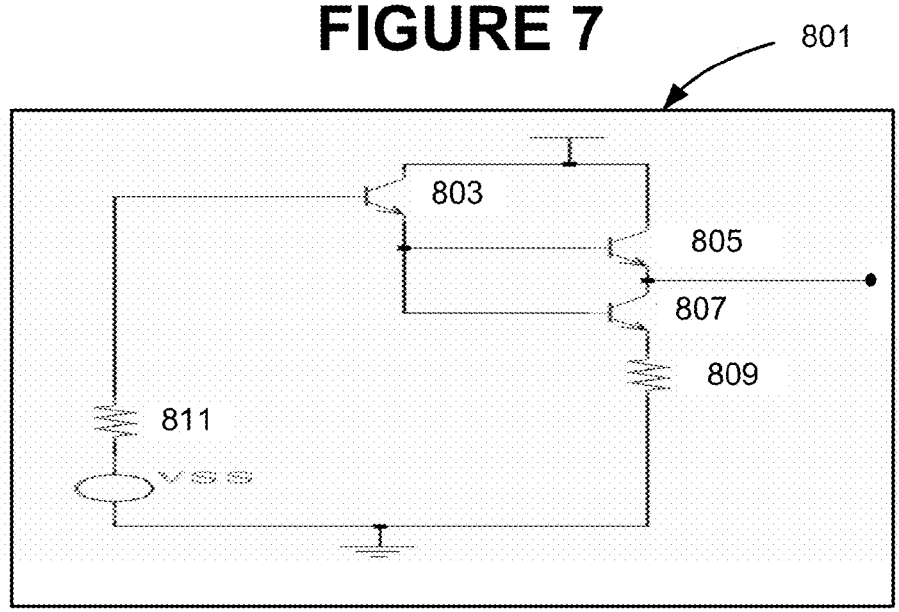
FIG. 8 illustrates a cascade circuit.

With various implementations of the invention, the operation 603 or the operation 609 may identify components where the output of the first is the input to the second. This configuration is often referred to as a cascade circuit. More particularly, transistors or component groups that are connected to the gate of another transistor or component group and also connected to the common node will be represented together. For example, FIG. 8 illustrates a circuit 801, which includes transistors 803, 805, and 807, and resistors 809 and 811. As can be seen from this figure, the transistors 805 and 807 are connected in "cascade" with the transistor 803. Accordingly, in various implementations of the invention, these transistors may be identified and grouped into component groups by the method 601.

Figure 9:
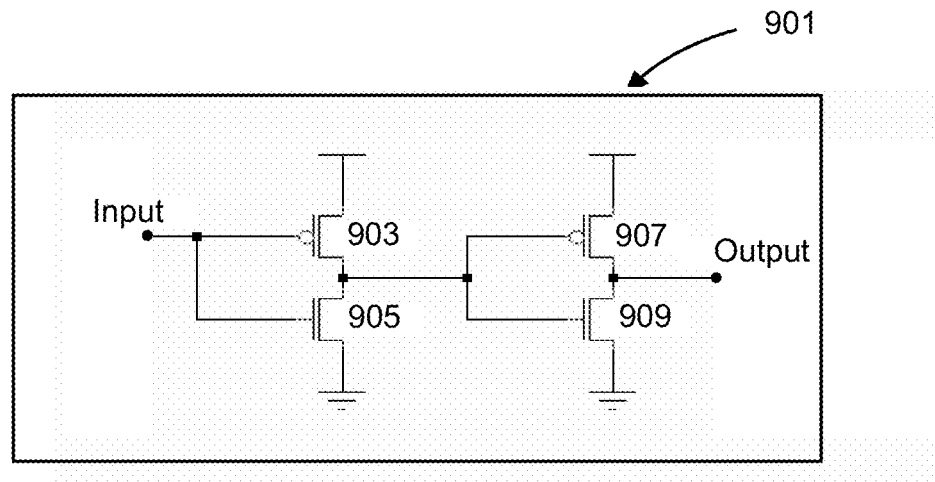
FIG. 9 illustrates a driver circuit.

With still various implementations of the invention, the operation 603 or the operation 609 may identify a group of components connected in series, where the source and the drain ports of the components are serially connected to an output. For example, FIG. 9 illustrates a circuit 901 that includes transistors 903 through 909. As can be seen from this figure, the transistors 903 and 905 have their source and drain respectively, serially connected to an output as do the transistors 907 and 909. Accordingly, with various implementations, the transistor groups 903 and 905 and well and 907 and 909 may be identified and component groups may be formed for each set of identified transistors.

Figure 10:
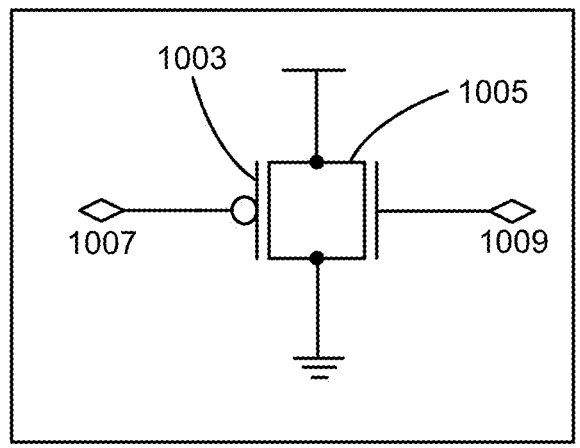
FIG. 10 illustrates a transmission gate circuit.

In some implementations of the invention, the operation 603 or the operation 609 may identify a group of components where the drain pins of a PMOS device and an NMOS device are connected and the source pins of the PMOS device and the NMOS device are connected and the input at the gate of these two devices is different. This configuration is referred to herein as a transmission gate. For example, FIG. 10 illustrates a circuit 1001, having a PMOS transistor 1003 and an NMOS transistor 1005, as well as an input 1007 and an output 1009. As can be seen from this figure, the PMOS device and the NMOS device have their source and drain pins connected, yet their gates are connected to different inputs. Accordingly, in various implementations, the transistors 1003 and 1005 may be identified and a component group formed that includes these transistors.

Illustrative Example of Netlist Partitioning

As described above, in various implementations of the invention, a netlist, such as for example the netlist 201, may be partitioned into component groups, by for example the method 601. FIG. 11 through FIG. 15 illustrate an example of partitioning a netlist into component groups. Although reference is made herein to a netlist, FIGS. 11 though 15 illustrate the netlist graphically, in schematic form, for clarity of presentation and for purposes of visualizing the component groups.

Figure 11:
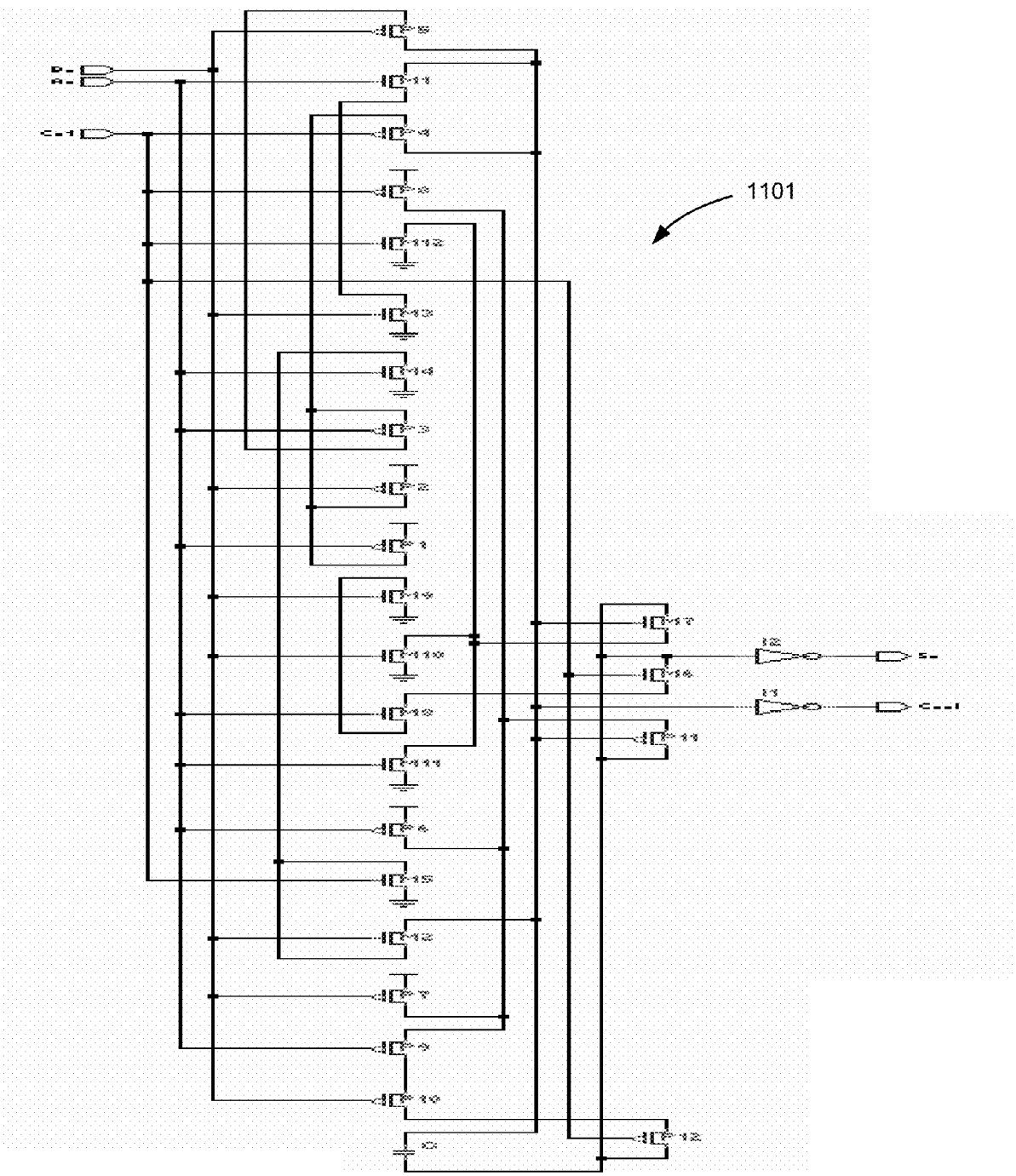
FIG. 11 illustrates a netlist.

FIG. 11 illustrates a netlist 1101, as can be seen from this figure, a number of hardware components 1103, such as for example, the transistor P5, the inverter I1, and the capacitor C, are included in the netlist 1101. As can be appreciated from this figure, the connectivity between the hardware components 1103 is apparent. However, the logical functions represented by this circuit are not apparent.

Figure 12:
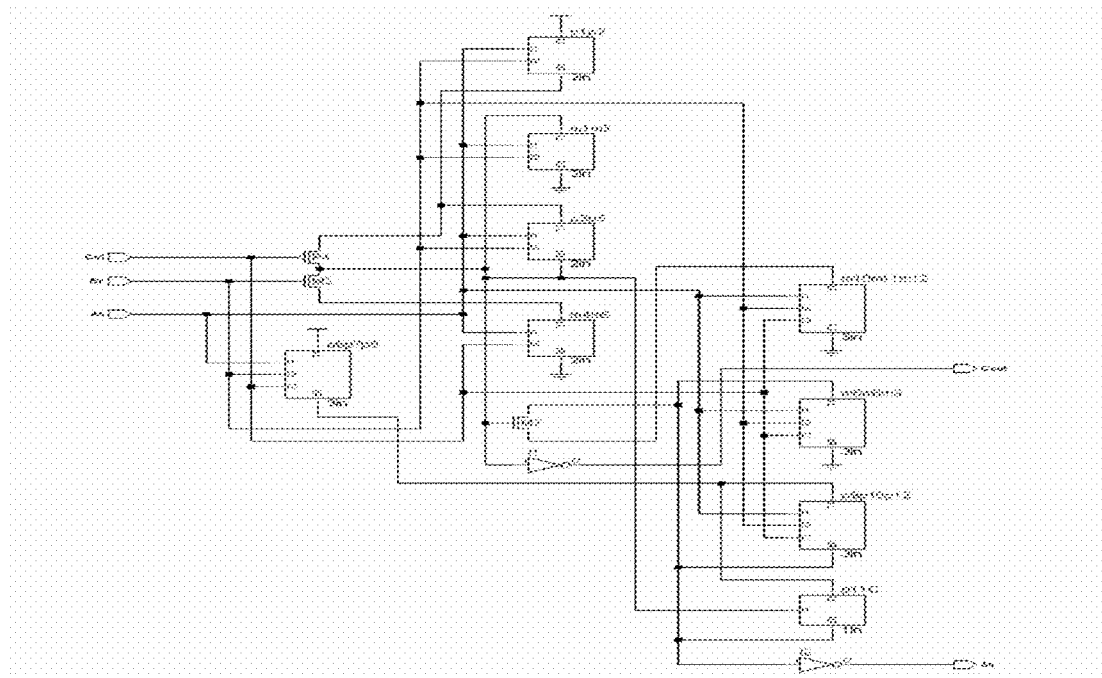
FIG. 12 illustrates the netlist of FIG. 11, having various components grouped together as component groups.

As stated above, components may be identified and grouped according to various known circuits, such as for example the AND circuit. In various implementations of the invention, a number of hardware components may be identified and grouped into component groups because they combined form known circuits. More particularly, the component groups [P1, P2], [P3, P5], [M4, M5], [M1, M3], [P6, P7, P8], [P9, P10, P12], [M10, M11, M12], and [M6, M8, M9] may be created because they perform a logic function, specifically either the AND or OR function. Additionally, the transistor P11 and the capacitor C may be included in a component group because they form a cascade grouping. These component groups may then be appended to the netlist. A netlist including these appended component groups is illustrated in FIG. 12. As can be seen from this figure, the hardware components included in each component groups have been replaced by the component group itself.

Figure 13:
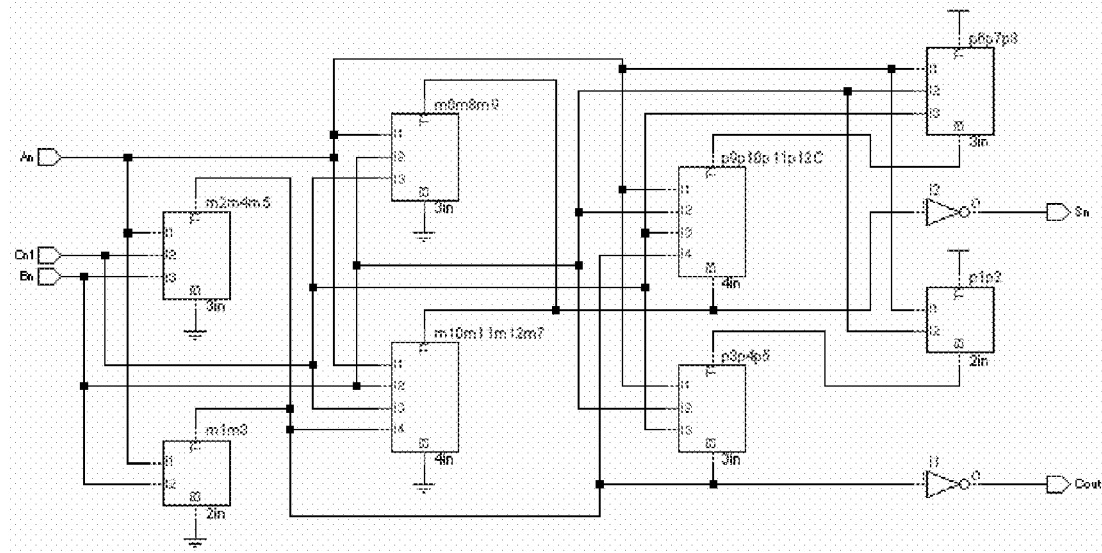
FIG. 13 illustrates the netlist of FIG. 12, having various components grouped together as component groups.
Figure 14:
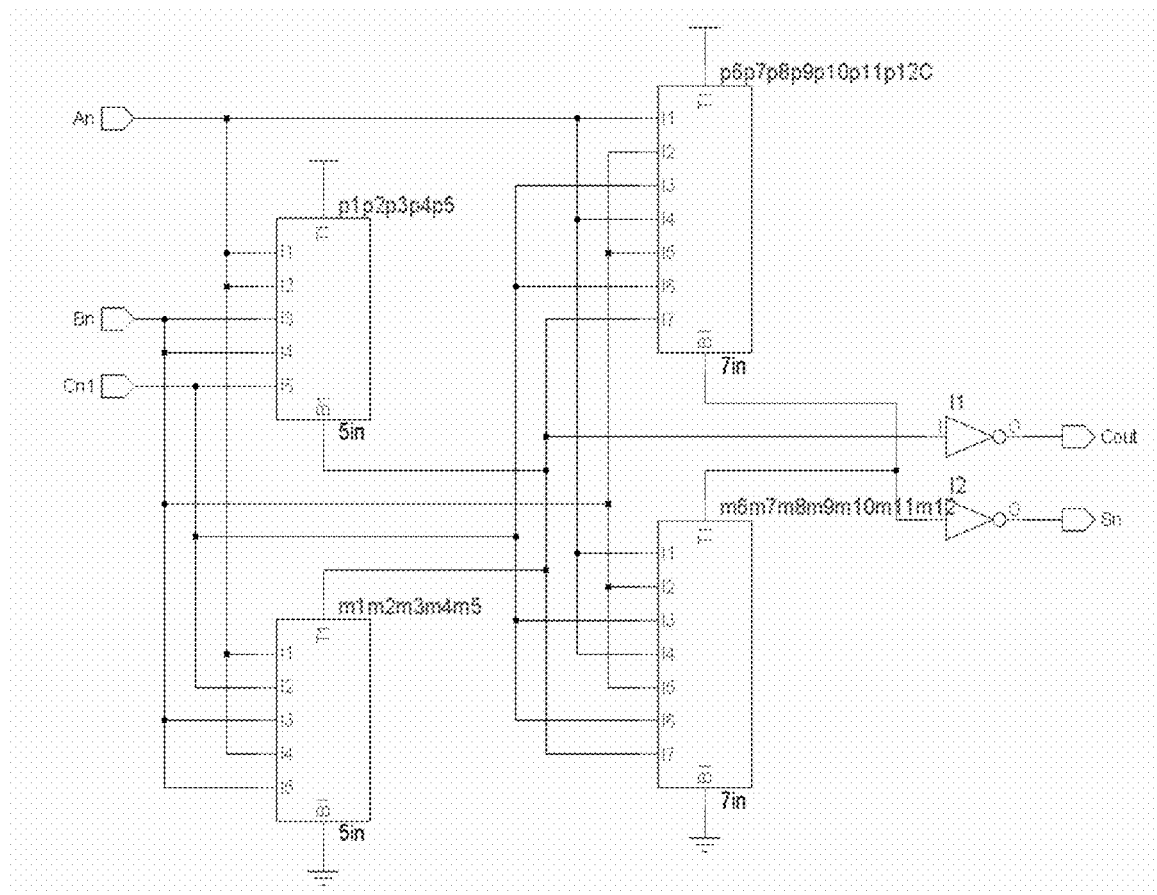
FIG. 14 illustrates the netlist of FIG. 13, having various components grouped together as component groups.

With various implementations of the invention, the netlist represented in FIG. 12 may be further partitioned. For example, the following components may be identified and included in component groups, [[P3, P5], P4], [[M4, M5], M2], [[P9, P10, P12], [P11, C]] and [[M10, M11, M12], M7]. This further partitioning of the netlist is represented in FIG. 13. As can be seen from FIG. 12 and FIG. 13, a component group may be comprised of either hardware components, component groups, or a combination of both. As FIG. 14 illustrates, still further partitioning is possible. As can be seen from FIG. 14, the component groups [P1, P2, P3, P4, P5], [M1, M2, M3, M4, M5], [P6, P7, P8, P9, P10, P11, P12, C] and [M6, M7, M8, M9 M10, M11] may be formed.

Figure 15:
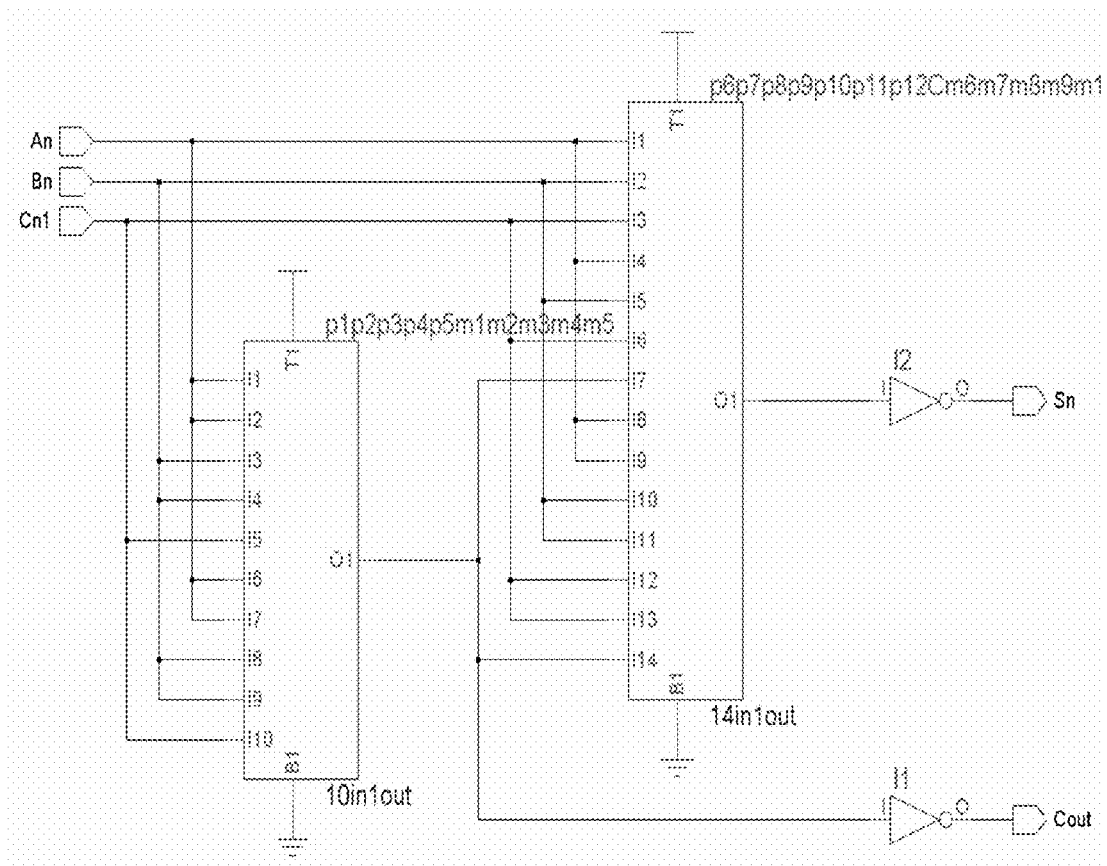
FIG. 15 illustrates the netlist of FIG. 14, having various components grouped together as component groups.

Furthermore, component groups [[P1, P2, P3, P4, P5], [M1, M2, M3, M4, M5]] and [[P6, P7, P8, P9, P10, P11, P12, C], [M6, M7, M8, M9 M10, M11]] may be identified as these components form driver blocks. As a result, a component group may be formed for each of these pairs of component groups. The resulting netlist is shown in FIG. 15. As can be seen from this figure, two component groups and the connectivity between the component groups is shown.

Component Group Placement and Routing

Referring back to FIG. 4, the method 401 for generating a schematic from a netlist includes operations for partitioning the netlist, arranging the partitioned components and routing connections between the partitioned components. More particularly, the operation 409 is provided for arranging the component groups, such as for example, the component groups shown in the netlists of FIGS. 12 through 15.

Figures 16, 18:
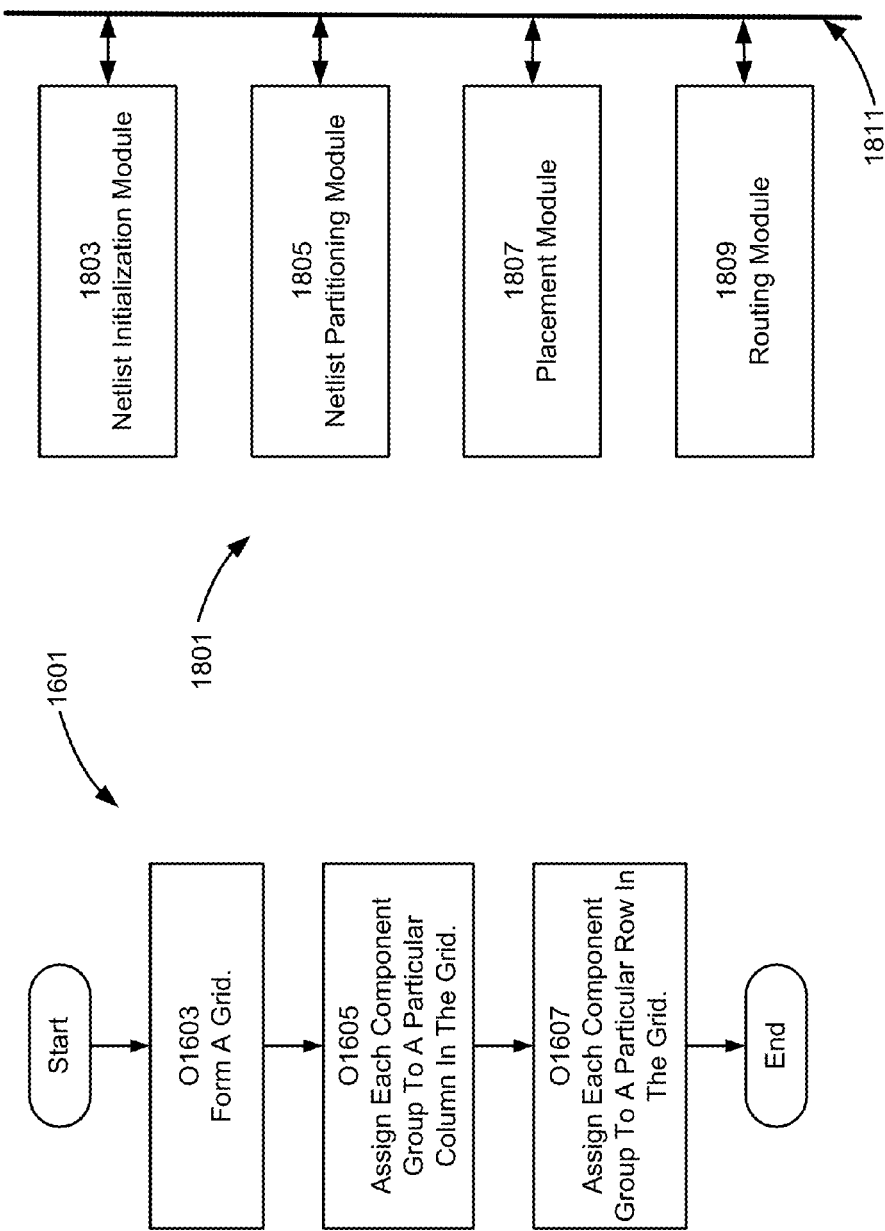
FIG. 16 illustrates a method of arranging component groups.
FIG. 18 illustrates a schematic generation tool.

FIG. 16 illustrates a method 1601 for arranging component groups within a schematic. With various implementations of the invention, the operation 409 may arrange the components according to the method 1601. As can be seen from this figure, the method 1601 includes an operation 1603 for forming grid based framework. In some implementations, the grid is formed by crossing horizontal and vertical lines, which may be referred to as columns and rows. The method 1601 further includes an operation 1605 for assigning each component group to a particular column in the grid according to a placement algorithm. For example, in various implementations, a depth-first search (DFS) algorithm may be used to identify each component group and assign columns to these components based upon their relative locations to each other.

The method 1601 additionally includes an operation 1607 for assigning each component group to a particular row in the grid. In various implementations, the operation 1607 applies a min-cut algorithm, followed by a simplex algorithm to vertically level the components within each column. The min-cut algorithm is described in detail in an article entitled An Efficient Heuristic Procedure for Partitioning Graphs, Bell Systems Technical Journal, 49(2), pp. 291-308, 1970, and authored by B. Kernighan and S. Lin, which article is incorporated entirely herein by reference. In various implementations of the invention, the operation 1607 arranges the component groups such that a minimum of node crossings and a minimum length of connections between nodes are achieved.

Returning to FIG. 4, the method 401 includes the operation 411 for routing connections between the component groups.

In various implementations of the invention, the operation 411 routes connections between the component groups according to a left edge algorithm. The left edge algorithm is discussed in greater detail in an article entitled *Efficient Algorithms For Channel-Routing*, IEEE Transactions on CAD of ICs and Systems, CAD Vol. 1, January 1982, pp 25-35, and authored by Yoshimara and Kuh, which article is incorporated entirely herein by reference.

As indicated by FIG. 4, in various implementations of the invention, once the component groups are arranged and connections have been routed between them, the placement of hardware component within the component groups may be done. The operation 413 may arrange the hardware components from top to bottom in component group based upon current flow from power to ground. More particularly, with some implementations of the invention, the hardware components directly connected to power may be placed higher up in the column and row locations corresponding to the component group. Then hardware component connected to these power connected component may be placed next, proceeding down to the ground connected components, which will be placed lowest in the column and row locations corresponding to the component group. In various implementations of the invention, a fixed horizontal and vertical spacing is maintained between components.

Figure 17:
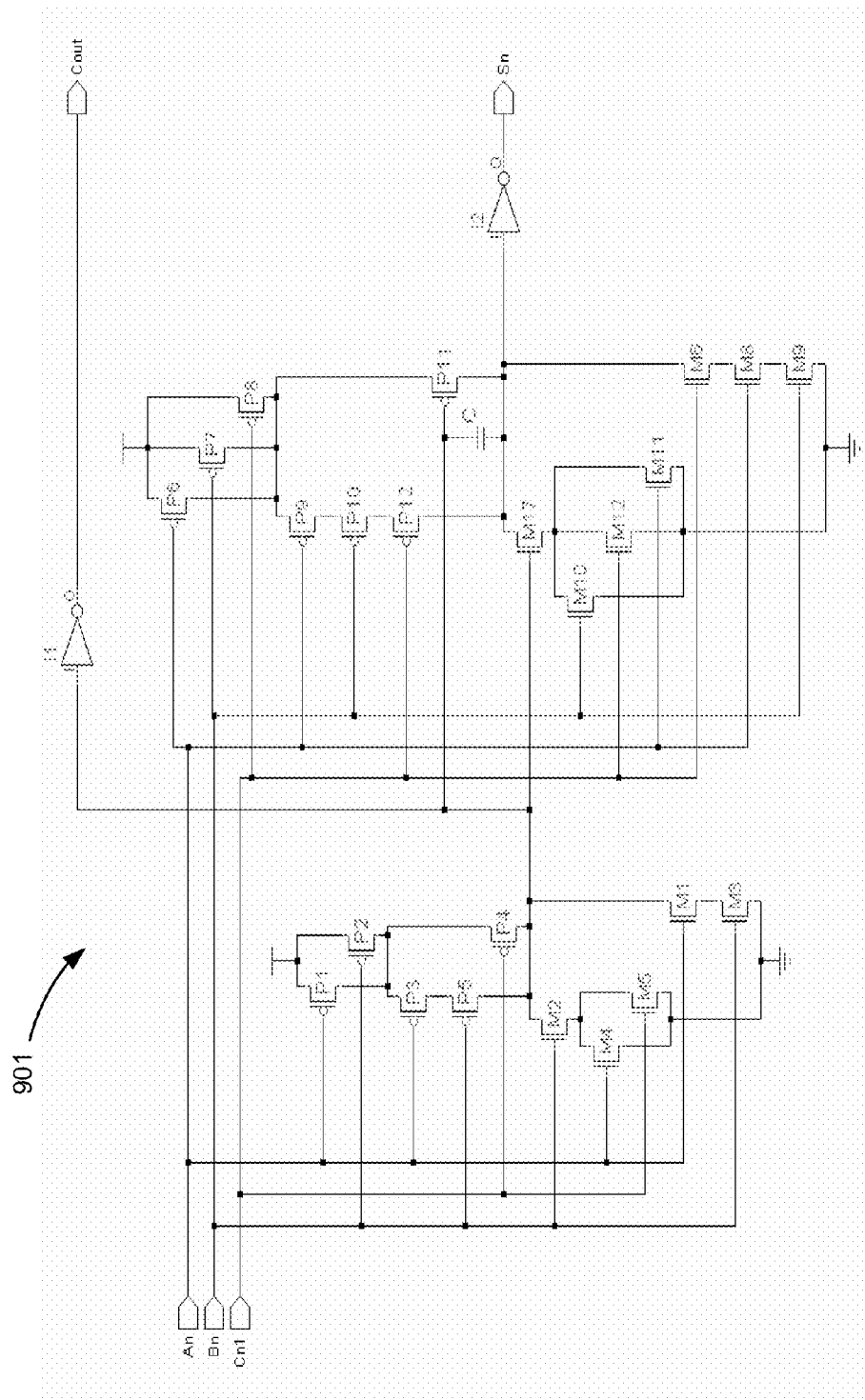
FIG. 17 illustrates a schematic generated for the netlist of FIG. 11 according to various implementations of the invention.

In various implementations, the operation 415 for routing connections between the hardware components, routes connections such that symmetry within the component group is maximized. FIG. 17 illustrates a schematic 1701 that has been generated according to various implementations of the present invention. The schematic 1701 corresponds to the netlist 1101 of FIG. 11. As those of skill in the art can appreciate, the schematic 1701 conveys more information to a designer than does the netlist 1101.

Apparatus for Schematic Generation from an Analog Netlist

FIG. 18 illustrates a schematic generation tool 1801. As can be seen from this figure, the schematic generation tool 1801 includes a netlist initialization module 1803, a netlist partitioning module 1805, a placement module 1807, and a routing module 1809. In various implementation of the invention, the schematic generation tool 1801 implemented as software executable by a computer.

In various implementations of the invention, the module 1803 is configured to access a netlist, and initialize the netlist, such as for example, by the method 503 shown in FIG. 5. With some implementations, the module 1805 is configured to partition the module according to the method 601 illustrated in FIG. 6. Still, in some implementations, the modules 1807 and 1809 may arrange and route connections between components, such as for example as described by reference to FIGS. 4 and 16. As can be seen from FIG. 18, the modules 1803-1809 are connected by a bus 1811.

CONCLUSION

Methods and apparatuses for generating a schematic from an analog netlist have been described. Particularly, as described by reference to various implementations of the invention, an analog netlist defining a number of hardware components and the connectivity between the hardware components is identified. Subsequently, the netlist is sorted and partitioned into component groups. The component groups are arranged and lines are routed between the component groups. Following which, the hardware components corresponding to each component group are arranged within the component groups and a schematic corresponding to the arranged hardware components is generated.

In various implementations of the invention, the netlist is partitioned into component groups by identifying hardware components that combined form a logic function, such as for example two transistors forming the AND function, forming a component group corresponding to the identified hardware components, and replacing the identified hardware components in the netlist with the component group. Subsequently, the components groups, and corresponding hardware components may be arranged, lines routed between the component groups, and a schematic generated based upon the arranged hardware components.

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. A computer implemented method for generating a schematic from a netlist comprising:
    using a computer system to access a first netlist, the first netlist defining a plurality of hardware components and a connectivity between the plurality of hardware components;
    sorting the first netlist to form a second netlist;
    processing the second netlist to form a plurality of component groups from the plurality of hardware components, each component group including two or more of the plurality of hardware components;
    arranging the plurality of component groups;
    routing first connections between the plurality of component groups to preserve the connectivity between the plurality of hardware components;
    arranging the plurality of hardware components within each component group;
    routing second connections within each component group to preserve the connectivity between the plurality of hardware components;
    diagramming a schematic, the schematic detailing the arranged plurality of hardware components, the first connections between the plurality of component groups, and the second connections within each component group; and
    saving the schematic to a memory storage location.

2. The computer implemented method recited in claim 1, further comprising:
    repeating the method act of processing the second netlist to form a plurality of component groups from the plurality of hardware components; and
    wherein ones of the newly formed component groups include two or more of the plurality of components groups.

3. The computer implemented method recited in claim 1, the method act of processing the second netlist to form a plurality of component groups from the plurality of hardware components further comprising:
    identifying ones of the plurality of hardware components that represent a transistor;
    identifying one or more cascade blocks, each of the one or more cascade blocks including,
    two or more of the plurality of hardware components that represent a transistor, or
    two or more of the plurality of component groups that include hardware components that represent a transistor, or one or more of the plurality of hardware components that represent a transistor and one or more of the plurality of component groups that include hardware components that represent a transistor, which based in part upon the connectivity between the plurality of hardware components and a simulated flow of current through the plurality of hardware components have their gates cascaded;

forming a component group for each cascade block; and associating the ones of the plurality of hardware components or ones of the plurality of component groups included within each cascade block with the corresponding component group.

4. The computer implemented method recited in claim 1, the method act of processing the second netlist to form a plurality of component groups from the plurality of hardware components further comprising:

identifying one or more driver blocks, each of the one or more driver blocks including, two or more of the plurality of hardware components that represent a transistor, or two or more of the plurality of component groups that include hardware components that represent a transistor, or one or more of the plurality of hardware components that represent a transistor and one or more of the plurality of component groups that include hardware components that represent a transistor, which based in part upon the connectivity between the plurality of hardware components and a simulated flow of current through the plurality of hardware components have their gates serially connected to an output pin;

forming a component group for each driver block; and associating ones of the plurality of hardware components or ones of the plurality of component groups included within each driver block with the corresponding component group.

5. The computer implemented method recited in claim 1, the method act of processing the second netlist to form a plurality of component groups from the plurality of hardware components further comprising:

identifying ones of the plurality of hardware components that represents a p-type metal-oxide-semiconductor transistor;

identifying ones of the plurality of hardware components that represents an n-type metal-oxide-semiconductor transistor;

identifying one or more transmission gates, each of the one or more transmission gates including a one of the plurality of hardware components that represent a p-type metal-oxide-semiconductor transistor that based in part upon the connectivity between the plurality of hardware components and a simulated flow of current through the plurality of hardware components has:

its drain pin connected to the drain pin of a one of the plurality of hardware components that represent an n-type metal-oxide-semiconductor;

its source pin connected to the source pin of the same one of the plurality of hardware components that represent the n-type metal-oxide-semiconductor; and its gate and the gate of the same one of the plurality of hardware components that represent the n-type metal-oxide-semiconductor connected to different input pins;

forming a component group for each transmission gate; and associating the ones of the plurality of hardware components included within each transmission gate with the corresponding component group.

6. The computer implemented method recited in claim 1, the method act of arranging the plurality of component groups comprising:

generating a two-dimensional layout, the two-dimensional layout being composed of a plurality of vertical lines and a plurality of horizontal lines that divide the two-dimensional layout into cells;

assigning each of the component groups to a horizontal positioning in the two-dimensional layout to minimize ones of the first connections between the component groups that cross; and assigning each of the component groups to a vertical positioning in the two-dimensional layout to minimize the length of the first connections between the component groups.

7. The computer implemented method recited in claim 6, wherein assigning each of the component groups to a horizontal positioning in the two-dimensional layout is based in part upon a depth-first search method.

8. The computer implemented method recited in claim 6, wherein assigning each of the component groups to a vertical positioning in the two-dimensional layout is based in part upon one of a min-cut method and a simplex method.

9. The computer implemented method recited in claim 6, the method act of arranging the plurality of hardware components within each component group comprising:

placing ones of the plurality of hardware components corresponding to each component group within the cell of the two-dimensional layout corresponding to the vertical and horizontal positioning assigned to the respective component group; and arranging the ones of the plurality of hardware components within each cell based in part upon a power pin and a ground pin.

10. The computer implemented method recited in claim 9, wherein the method act of arranging the ones of the plurality of hardware components within each cell based in part upon a power pin and a ground pin levels the plurality of hardware components vertically according to their respective connection in relation to the power pin and the ground pin.

11. The computer implemented method recited in claim 9, wherein the method act of routing first connections between the plurality of component groups preserves the connectivity between the plurality of hardware components based in part upon a left edge algorithm.

12. The computer implemented method recited in claim 6, wherein a plurality of cells within the two-dimensional layout do not have components groups or hardware components associated with them.

13. One or more computer-readable devices storing software instructions for enabling a computer to perform a set of predetermined operations the set of predetermined operations including:

accessing a first netlist, the first netlist defining a plurality of hardware components and a connectivity between the plurality of hardware components;

sorting the first netlist to form a second netlist;

processing the second netlist to form a plurality of component groups from the plurality of hardware components, each component group including one or more of the plurality of hardware components;

arranging the plurality of component groups;

routing first connections between the plurality of component groups to preserve the connectivity between the plurality of hardware component;

arranging the plurality of hardware component within each component group;

routing second connections within each component group to preserve the connectivity between the plurality of hardware components;

diagramming a schematic, the schematic detailing the arranged plurality of hardware components, the first connections between the plurality of component groups, and the second connections within each component group; and saving the schematic to a memory storage location.

14. The one or more computer-readable devices recited in claim 13, the set of predetermined operations further comprising:

repeating the predetermined operation of processing the second netlist to form a plurality of component groups from the plurality of hardware components; and wherein ones of the newly formed component groups include one or more of the plurality of components groups.

15. The one or more computer-readable devices recited in claim 13, the predetermined operation of processing the second netlist to form a plurality of component groups from the plurality of hardware components further comprising:

identifying ones of the plurality of hardware components that represent a transistor;

identifying one or more cascade blocks, each of the one or more cascade blocks including, two or more of the plurality of hardware components that represent a transistor, or two or more of the plurality of component groups that include hardware components that represent a transistor, or one or more of the plurality of hardware components that represent a transistor and one or more of the plurality of component groups that include hardware components that represent a transistor, which based in part upon the connectivity between the plurality of hardware components and a simulated flow of current through the plurality of hardware components have their gates cascaded;

forming a component group for each cascade block; and associating the ones of the plurality of hardware components or ones of the plurality of component groups included within each cascade block with the corresponding component group.

16. The one or more computer-readable devices recited in claim 13, the predetermined operation of processing the second netlist to form a plurality of component groups from the plurality of hardware components further comprising:

identifying one or more driver blocks, each of the one or more driver blocks including, two or more of the plurality of hardware components that represent a transistor, or two or more of the plurality of component groups that include hardware components that represent a transistor, or one or more of the plurality of hardware components that represent a transistor and one or more of the plurality of component groups that include hardware components that represent a transistor, which based in part upon the connectivity between the plurality of hardware components and a simulated flow of current through the plurality of hardware components, have their gates serially connected to an output pin;

forming a component group for each driver block; and associating ones of the plurality of hardware components or ones of the plurality of component groups included within each driver block with the corresponding component group.

17. The one or more computer-readable devices recited in claim 13, the predetermined operation for processing the second netlist to form a plurality of component groups from the plurality of hardware components further comprising:

identifying ones of the plurality of hardware components that represents a p-type metal-oxide-semiconductor transistor;

identifying ones of the plurality of hardware components that represents an n-type metal-oxide-semiconductor transistor;

identifying one or more transmission gates, each of the one or more transmission gates including a one of the plurality of hardware components that represent a p-type metal-oxide-semiconductor transistor that based in part upon the connectivity between the plurality of hardware components and a simulated flow of current through the plurality of hardware components has:

its drain pin connected to the drain pin of a one of the plurality of hardware components that represent an n-type metal-oxide-semiconductor;

its source pin connected to the source pin of the same one of the plurality of hardware components that represent the n-type metal-oxide-semiconductor; and its gate and the gate of the same one of the plurality of hardware components that represent the n-type metal-oxide-semiconductor connected to different input pins;

forming a component group for each transmission gate; and associating the ones of the plurality of hardware components included within each transmission gate with the corresponding component group.

18. The one or more computer-readable devices recited in claim 13, the predetermined operation of arranging the plurality of component groups comprising:

generating a two-dimensional layout, the two-dimensional layout being composed of a plurality of vertical lines and a plurality of horizontal lines that divide the two-dimensional layout into cells;

assigning each of the component groups to a horizontal positioning in the two-dimensional layout to minimize ones of the first connections between the component groups that cross; and assigning each of the component groups to a vertical positioning in the two-dimensional layout to minimize the length of the first connections between the component groups.

19. The one or more computer-readable devices recited in claim 18, the predetermined operation of arranging the plurality of hardware components within each component group comprising:

placing ones of the plurality of hardware components corresponding to each component group within the cell of the two-dimensional layout corresponding to the vertical and horizontal positioning assigned to the respective component group; and arranging the ones of the plurality of hardware components within each cell based in part upon a power pin and a ground pin.

20. The one or more computer-readable devices recited in claim 19, wherein the predetermined operation of arranging the ones of the plurality of hardware components within each cell based in part upon a power pin and a ground pin levels the plurality of hardware components vertically according to their respective connection in relation to the power pin and the ground pin.

21. The one or more computer-readable devices recited in claim 18, wherein a plurality of cells within the two-dimensional layout do not have components groups or hardware components associated with them.

22. The computer implemented method recited in claim 1, the method act of processing the second netlist to form a plurality of component groups from the plurality of hardware components further comprising:
    identifying one or more logic blocks, each of the one or more logic blocks including two or more of the plurality of hardware components, which based in part upon the connectivity between the plurality of hardware components perform a logic function chosen from a NAND function, a NOR function, an AND function, an OR function, an XOR function, and an XNOR function; and
    forming each component group to include one or more of the logic blocks.

23. The computer implemented method recited in claim 1, further comprising:
    appending the plurality of component groups to the second netlist; and
    removing the plurality of hardware components corresponding with each component group from the second netlist.

24. The one or more computer-readable devices recited in claim 13, the predetermined operation of processing the second netlist to form a plurality of component groups from the plurality of hardware components further comprising:
    identifying one or more logic blocks, each of the one or more logic blocks including two or more of the plurality of hardware components, which based in part upon the connectivity between the plurality of hardware components perform a logic function chosen from a NAND function, a NOR function, an AND function, an OR function, an XOR function, and an XNOR function; and
    forming each component group to include one or more of the logic blocks.

25. The one or more computer-readable devices recited in claim 13, the predetermined operation of processing the second netlist to form a plurality of component groups from the plurality of hardware components further comprising:
    appending the plurality of component groups to the second netlist; and
    removing the plurality of hardware components corresponding with each component group from the second netlist.

26. A computer implemented method for generating a schematic from a netlist, comprising:
    using a computer system to sort hardware components within the netlist to create a sorted netlist;
    processing the sorted netlist to create a partitioned netlist having a plurality of component groups by recursively:
        (a) identifying one or more pluralities of components of the sorted netlist, each plurality of components forming a component group representing a known circuit, and each plurality of components including one of: (i) two or more hardware components, (ii) one or more hardware components and one or more component groups, or (iii) two or more component groups,
        (b) removing the one or more pluralities of components of the sorted netlist from the sorted netlist, and
        (c) appending the component group formed by each of the one or more pluralities of components to the sorted netlist; and
    generating a schematic from the partitioned netlist by:
        (a) forming a two-dimensional layout comprising a plurality of vertical lines and a plurality of horizontal lines,
        (b) assigning each component group of the partitioned netlist to a vertical positioning in the two-dimensional layout,
        (c) assigning each component group of the partitioned netlist to a horizontal positioning in the two-dimensional layout,
        (d) routing first connections between the plurality of component groups of the partitioned netlist to preserve a connectivity between the component groups,
        (e) arranging the plurality of hardware components within each component group of the partitioned netlist, and
        (f) routing second connections between the plurality of hardware components within each component group of the partitioned netlist to preserve a connectivity between the hardware components within each component group.

27. The computer implemented method recited in claim 26, wherein the plurality of known circuits includes a circuit performing a logic function chosen from a NAND function, a NOR function, an AND function, an OR function, an XOR function, and an XNOR function.

* * * * *